US007515450B2

(12) United States Patent
Nakajima et al.

(10) Patent No.: US 7,515,450 B2
(45) Date of Patent: Apr. 7, 2009

(54) NONVOLATILE SEMICONDUCTOR STORAGE DEVICE

(75) Inventors: Tsutomu Nakajima, Higashimurayama (JP); Keiichi Yoshida, Musashimurayama (JP)

(73) Assignee: Renesas Technology Corp., Tokyo (JP)

( * ) Notice: Subject to any disclaimer, the term of this patent is extended or adjusted under 35 U.S.C. 154(b) by 92 days.

(21) Appl. No.: 11/802,168

(22) Filed: May 21, 2007

(65) Prior Publication Data

US 2007/0223275 A1  Sep. 27, 2007

Related U.S. Application Data

(63) Continuation of application No. 10/503,619, filed as application No. PCT/JP02/01845 on Feb. 28, 2002, now Pat. No. 7,233,523.

(51) Int. Cl.
*G11C 5/02* (2006.01)

(52) U.S. Cl. .................. 365/51; 365/63; 365/189.2

(58) Field of Classification Search ............. 365/189.2, 365/51, 185.05, 185.11, 230.03, 63
See application file for complete search history.

(56) References Cited

U.S. PATENT DOCUMENTS

| 5,115,413 | A | 5/1992 | Sato et al. ............. 365/230.09 |
| 5,590,073 | A * | 12/1996 | Arakawa et al. ....... 365/185.08 |
| 5,870,218 | A | 2/1999 | Jyouno et al. .......... 365/185.03 |
| 6,208,542 | B1 * | 3/2001 | Wang et al. ............... 365/45 |
| 6,320,791 | B1 | 11/2001 | Mio ....................... 365/185.22 |
| 6,359,806 | B1 | 3/2002 | Nozoe et al. ........... 365/185.09 |
| 6,515,900 | B2 | 2/2003 | Kato et al. .............. 365/185.11 |
| 6,614,685 | B2 | 9/2003 | Wong .................... 365/185.11 |
| 6,965,527 | B2 * | 11/2005 | Fasoli et al. ............ 365/189.15 |
| 7,002,848 | B2 | 2/2006 | Takase et al. .......... 365/185.28 |
| 2004/0210729 | A1 | 10/2004 | Horii et al. .................. 711/156 |
| 2008/0096327 | A1 * | 4/2008 | Lee et al. ..................... 438/129 |

FOREIGN PATENT DOCUMENTS

| JP | 2-246087 | 10/1990 |
| JP | 10-92186 | 4/1998 |
| JP | 2001-23383 | 1/2001 |
| JP | 2001-85633 | 3/2001 |

\* cited by examiner

*Primary Examiner*—VanThu Nguyen
*Assistant Examiner*—Alexander Sofocleous
(74) *Attorney, Agent, or Firm*—Miles & Stockbridge P.C.

(57) ABSTRACT

A flash memory 1 based on the multilevel storage technology for storing the information of two or more bits is provided with four banks 2a to 2d. For example, in the left side of the bank 2a, a data latch 6a is provided along one short side of the bank 2a, while in the right side thereof, a data latch 6b is provided along the other short side of the bank 2a. At the lower side of the data latches 6a, 6b, arithmetic circuits 7a, 7b are provided. The data latches 6a, 6b are respectively formed of SRAMs. A sense latch 5a is divided to one half in the right and left directions with reference to the center of sense latch row. The divided sense latch 5a is connected with the data latches 6a, 6b via the signal lines respectively allocated along both short sides of the bank 2a.

5 Claims, 4 Drawing Sheets

NONVOLATILE SEMICONDUCTOR STORAGE DEVICE

CROSS-REFERENCE TO RELATED APPLICATION

This application is a continuation of application Ser. No. 10/503,619 filed Mar. 18, 2005, now U.S. Pat. No. 7,233,523 which is a 371 of PCT/JP02/01845 filed Feb. 28, 2002.

TECHNICAL FIELD

The present invention relates to a nonvolatile semiconductor storage device and particularly to technology which can be adapted effectively to reduction in chip layout area of a multilevel flash memory.

BACKGROUND ART

In recent years, semiconductor memories such as flash memories are in the trend that large capacity and low cost data are introduced more and more rapidly. As the technology corresponding to novel attempt in introduction of such large capacity data, a multilevel flash memory utilizing the multilevel storage technology has been very popular in which a plurality of threshold voltages of a certain voltage level are set depending on the amount of charges accumulated in a charge storage layer of a memory chip and the data of two bits or more is stored.

According to discussion by the inventors of the present invention, the multilevel flash memory is provided with a structure that a memory cell array is divided, for example, to about four banks. Each bank has a structure that a sense latch is provided at the center thereof and data latches for storing write data are also provided in the vicinity of the two longer sides of the bank. The sense latches hold the information of the sense operation and the write object cells, while the data latches store write data.

The Japanese Unexamined Patent Publication No. Hei 02(1990)-246087 is an example of the document which describes in details layout technology of peripheral circuits in the semiconductor memory of this type. This document specifically describes the layout technology of a main amplifier provided within a DRAM.

However, the inventors of the present invention have found the following problems in the layout technology of sense latch and data latch in the multilevel flash memory as described above.

Namely, such a multilevel flash memory is accompanied by a problem that the layout area required for the data latch becomes wide because the data of two bits or more is transferred with only one memory cell and the chip area also becomes large to hinder reduction in size of the flash memory because a degree of freedom of layout is also restricted.

An object of the present invention is to provide a nonvolatile semiconductor storage device which can remarkably reduce chip area without deterioration of data transfer rate by optimizing layout of data latch.

The above and other objects and novel features of the present invention will be apparent from the description of this specification and the accompanying drawings.

DISCLOSURE OF THE INVENTION

The present invention is provided with a plurality of memory banks consisting of a rectangular shape memory array in which a plurality of threshold voltages of a certain voltage level are set and memory cells storing data of two bits or more in each cell are arranged in the form of an array, a sense latch allocated along one longer side of the memory bank to hold the information of sense operation and write object memory cells, first and second arithmetic circuits which are respectively allocated along one and the other short sides of the memory bank to perform multilevel arithmetic operation of the written data and determine a threshold voltage level to be written into the memory cell, and first and second buffers which are respectively allocated along one and the other short sides of the memory bank to store the write data.

Moreover, in the present invention, the input/output line connected to the sense latch is divided into two portions with reference to the center of the sense latch row, and one input/output line is wired along one short side of the memory bank, while the other input/output line is wired along the other short side of the memory bank.

In addition, the first and second buffers of the present invention are formed of SRAMs (Static Random Access Memories).

Moreover, the plural memory banks, sense latches, first and second arithmetic circuits and first and second buffers of the present invention are allocated over the semiconductor chip which is restricted in the length of the longitudinal direction depending on the package size.

BEST MODE FOR CARRYING OUT THE INVENTION

Figure 1:
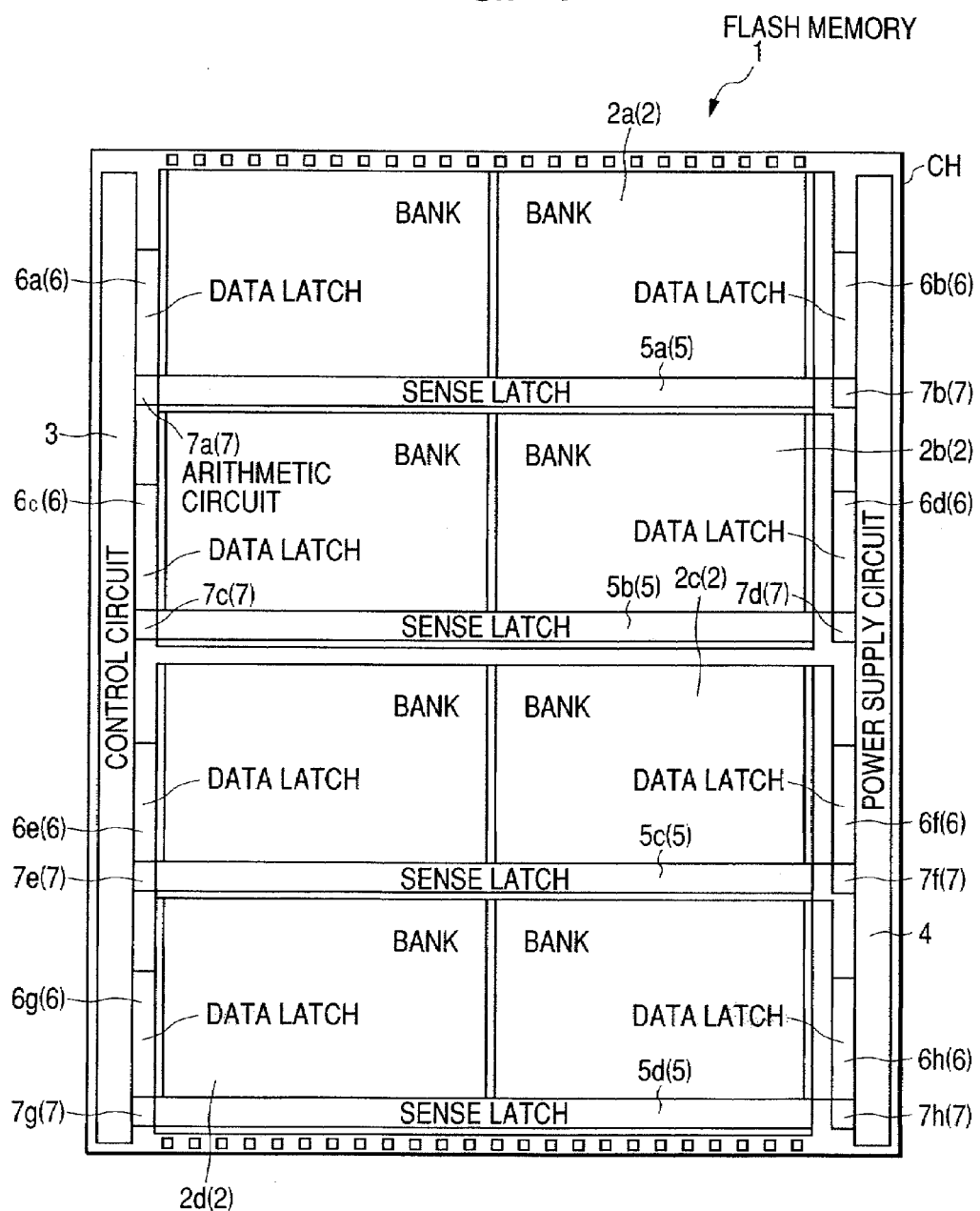
FIG. 1 is a chip layout diagram of a flash memory as a preferred embodiment of the present invention.

The present invention will be described in detail with reference to the accompanying drawings. The like elements provided with the like functions are designated with the like reference numerals throughout the drawings for describing the preferred embodiment thereof for elimination of the repetitive description.

In the present embodiment, a flash memory 1 is a multilevel flash memory utilizing the multilevel storage technology for storing the information of two bits or more by setting a plurality of threshold voltages of a certain voltage level to one memory cell.

This flash memory 1 is formed, as illustrated in FIG. 1, of a memory array 2, a control circuit 3, a power supply circuit 4, sense latches 5, data latches 6, and arithmetic circuits 7.

In the flash memory 1, the control circuit 3 is provided along the peripheral portion in one longitudinal direction of a semiconductor chip CH. The control circuit 3 comprises a logic control circuit, an input/output control circuit, a command register, an address resister, and direct/indirect peripheral circuits such as column/row address decoders.

The logic control circuit temporarily stores control signals inputted from a host such as a microcomputer as the connection destination to control operation logic. The input/output control circuit controls input and output of signals such as external addresses and data inputted/outputted to/from the host.

The column/row address decoder decodes the signals on the basis of the column/row addresses. The control circuit controls the sense latches 5, data latches 6 and arithmetic circuits 7 under the control of the logic control circuit.

Moreover, the memory array 2 is allocated at the center of the semiconductor chip CH. In the memory array 2, memory cells which are formed as the minimum unit of storage are regularly arranged like an array.

This memory array 2 is divided into the four banks (memory banks) 2a to 2d to the lower side from the upper side to form a so-called multibank structure in which each bank 2a to 2d operates independently.

In addition, the power supply circuit 4 is provided in the peripheral portion in the other longitudinal direction of the semiconductor chip CH. This power supply circuit 4 generates a verification voltage used for the verification operation and various step-up voltages and step-down voltages used for data writing operation and also supplies these voltages to each of the banks 2a to 2d of the memory array 2.

The sense latches 5 are formed of four sense latches 5a to 5d and these sense latches 5a to 5d are respectively provided at the lower side of the banks 2a to 2d (along one longitudinal side of the banks 2a to 2d). These sense latches 5a to 5d hold the information of the sense operation and write object cells.

The data latches 6 are formed of data latches (first buffers) 6a, 6c, 6e, 6g and data latches (second buffers) 6b, 6d, 6f, 6h. These data latches 6a to 6h store the write data. The data latches 6a to 6h are respectively provided in unit of two latches in both right and left sides of each of the banks 2a to 2d. For example, in the case of bank 2a, the data latches 6a, 6b are respectively provided in both right and left sides of the bank 2a.

In the same manner, the arithmetic circuits 7 are also formed of eight arithmetic circuits 7a, 7c, 7e, 7g (first arithmetic circuits) and 7b, 7d, 7f, 7h (second arithmetic circuits). These arithmetic circuits 7a to 7h are respectively provided in unit of two circuits at the lower side of the data latches 6a to 6h in both right and left sides of the banks 2a to 2d. These arithmetic circuits 7a to 7h perform multilevel arithmetic operation of data written into the data latches 6a to 6h to determine a threshold voltage level to be written into the memory cells of the banks 2a to 2d.

Here, the layout of the sense latches 5, data latches 6 and arithmetic circuit 7b will be described in detail.

Figure 2:
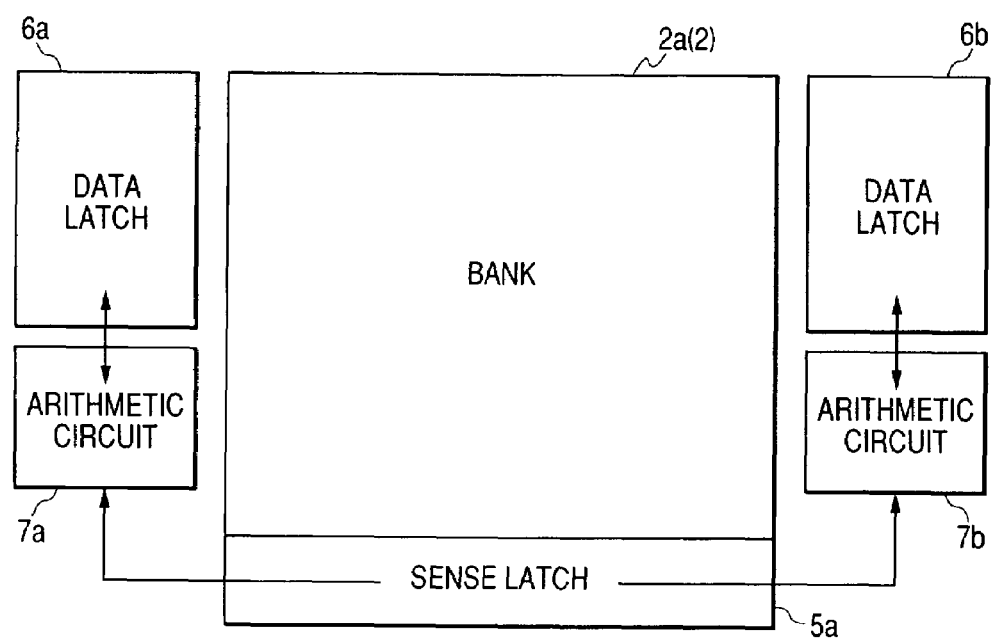
FIG. 2 is a layout diagram of a bank, a sense latch, data latches and an arithmetic circuit of a memory mat provided to a flash memory of FIG. 1.

FIG. 2 illustrates a layout of the sense latch 5a, data latches 6a, 6b and arithmetic circuits 7a, 7b provided in the periphery of the bank 2a of a memory mat 2. Moreover, the sense latches 5b to 5d, data latches 6c to 6h and arithmetic circuits 7c to 7h are also provided in the layout and circuit structure which are similar to that of FIG. 2.

As illustrated in FIG. 2, the data latch 6a is provided along one short side of the bank 2a in the left side of bank 2a, while the data latch 6b is provided along the other short side of the bank 2a in the right side of bank 2a.

In the same manner, the arithmetic circuit 7a is provided at the lower side of the data latch 6a in the left side of the bank 2a, and the arithmetic circuit 7b, at the lower side of the data latch 6b in the right side of the bank 2a.

Figure 3:
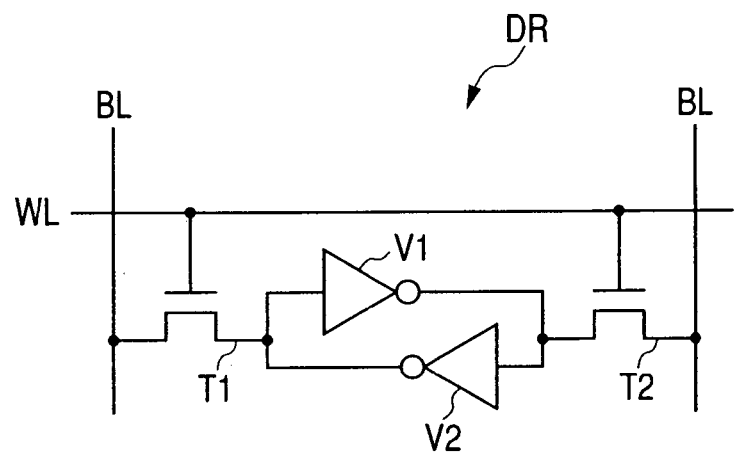
FIG. 3 is a circuit diagram of the data latches of FIG. 2.

Moreover, the data latches 6a, 6b are respectively formed of SRAMs. FIG. 3 illustrates an example of the circuit in which the latch circuit DR of the data latches 6a, 6b is formed of SRAMs.

As illustrated in the figure, the latch circuit DR is formed of the so-called six-transistor CMOS consisting of transistors T1, T2 and inverters V1, V2.

The data latches 6a, 6b are respectively formed of SRAMs which are arranged in the form of an array to store the data to be written or read with at least single write or read operation to or from the bank 2a.

Figure 4:
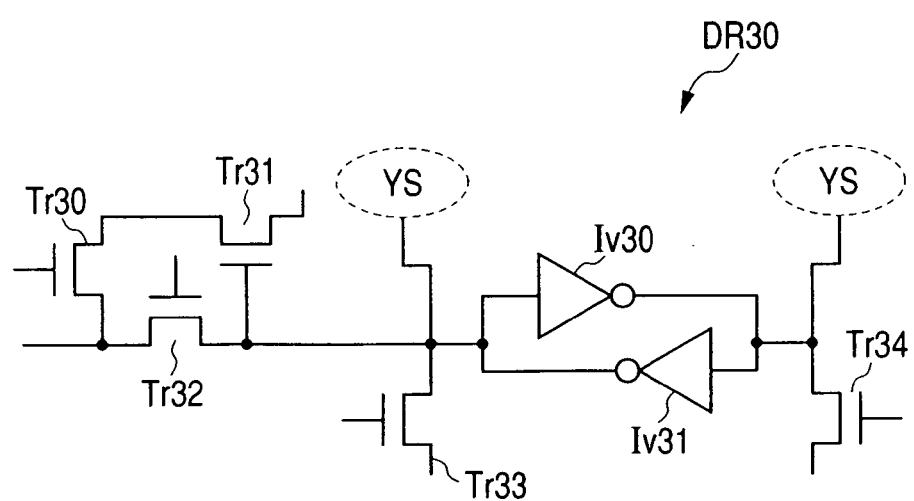
FIG. 4 is a circuit diagram illustrating an example of the data latch circuit which the inventors of the present invention have discussed.

FIG. 4 is a circuit diagram illustrating a structure of the ordinary data latch circuit DR30 which the inventors of the present invention have discussed. In this case, the data latch circuit DR30 is formed of two inverters Iv30, Iv31 and five transistors Tr30 to Tr34.

As described above, the number of transistors can be remarkably reduced by forming the data latches 6a, 6b with the SRAMs. Since the layout area of the data latches 6a, 6b can be reduced, the semiconductor chip CH can be formed in small size.

Figure 5:
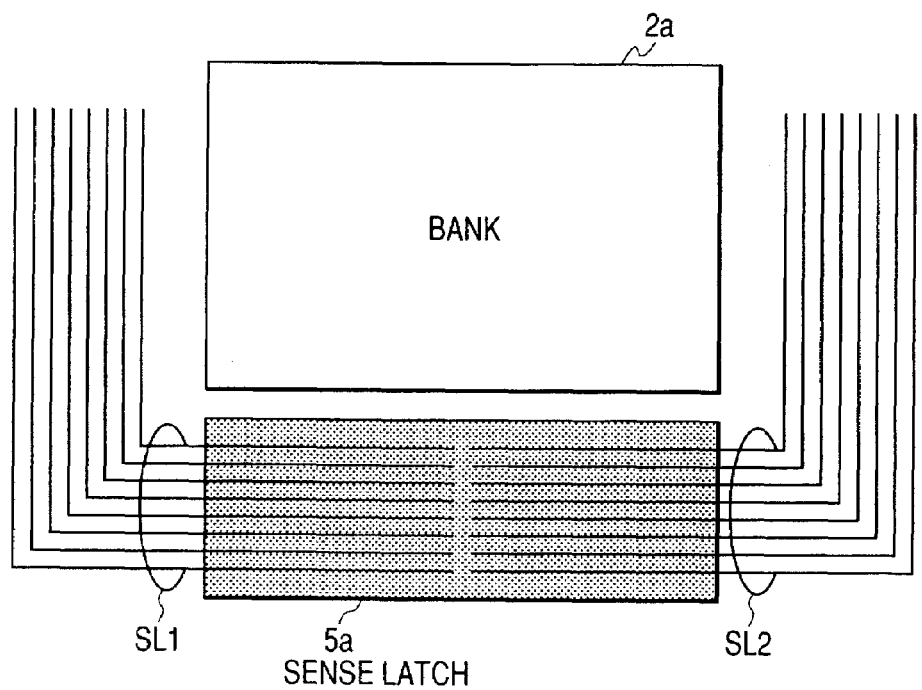
FIG. 5 is a layout diagram of the signal lines for transferring the write data or the like to the sense latch provided to the flash memory of FIG. 1.

Moreover, as illustrated in FIG. 5, the sense latch 5a is divided to ½ in both right and left directions with reference to the center of the sense latch row. In this sense latch 5a, the sense latch of the divided left side is connected with the data latch 6a via the signal line SL1 as the common I/O, while the sense latch of the divided right side is connected with the data latch 6b via the signal line SL2.

Since these signal lines SL1, SL2 are respectively allocated along both short right and left sides of the bank 2a, namely along both short sides of the bank 2a, the data can be transferred in parallel and the transfer rate can therefore be doubled.

Simultaneously, since the data latches 6a, 6b are allocated in both sides, the number of signal lines SL1, SL2 wired to the sense latch 5a can be reduced to one half. Accordingly, the wiring regulations for the sense latch 5a due to the signal lines SL1, SL2 can also be lowered.

In addition, in the flash memory 1 based on the multilevel storage technology, data transfer can be performed repeatedly between the data latches 6a, 6b and sense latch 5a through the verification operation for the threshold voltage to check accuracy of the data during the write operation.

Therefore, higher data transfer rate can be realized through the parallel data transfer between the data latches 6a, 6b and sense latch 5a and accordingly, the high speed write operation of the flash memory 1 can also be realized.

As a result, according to the present embodiment, since the lay out are a can be reduced remarkably by forming the data latches 6a to 6h with the SRAMs, the semiconductor chip CH can be reduced in size and can also be saved in chip cost.

In addition, the parallel data transfer can be achieved and the transfer rate can also be doubled by respectively allocating the signal lines SL1, SL2 in both right and left sides of the banks 2a to 2d.

Moreover, in the flash memory of this embodiment, the data latches are provided along the short side direction of the bank. However, when a vacant area is provided in the side of the short side direction of the bank, it is enough to allocate the data latches in the desired place of such vacant area.

Furthermore, in this embodiment, the flash memory is formed in the type of structure that a plurality of threshold voltages are set by controlling the amount of charges to be accumulated in the charge accumulation layer of a memory cell. It is also possible, however, to form the flash memory with the memory cells of the type that a plurality of are as a reset locally to accumulate the charges to the charge accumulation layer of the memory cell.

Moreover, the multilevel flash memory is formed in this embodiment. However, it is also possible to introduce a binary level flash memory in which one-bit information is stored in one memory cell.

Although the preferred embodiment of the present invention has been disclosed, it is needless to say that various modifications, additions and substitutions are possible, without departing from the scope of the invention.

INDUSTRIAL APPLICABILITY

As described above, the nonvolatile semiconductor storage device of the present invention is suitable for the technology for reduction in the layout area of semiconductor chip used in the multilevel flash memory.

The invention claimed is:

1. A nonvolatile memory apparatus structured on a semiconductor substrate, which has a rectangular shape, comprising:
   a control circuit arranged along one longer side of the semiconductor substrate;
   a power circuit arranged along another longer side of the semiconductor substrate;
   a nonvolatile memory array arranged between the control circuit and the power circuit; and
   a RAM array arranged between the control circuit and the nonvolatile memory array and between the power circuit and the nonvolatile memory array.

2. A nonvolatile memory apparatus according to claim 1, comprising a plurality of terminals, a first group of which is arranged along one shorter side of the semiconductor substrate, and a second group of which is arranged along another shorter side of the semiconductor substrate.

3. A nonvolatile memory apparatus according to claim 2, wherein the nonvolatile memory array comprises a plurality of nonvolatile memory cells, each of which is capable of storing plural bit data.

4. A nonvolatile memory apparatus according to claim 3, wherein the RAM array comprises a plurality of SRAM cells for storing data to store to the nonvolatile memory array, or for storing data to be read out from the nonvolatile memory array.

5. A nonvolatile memory apparatus according to claim 1, wherein the nonvolatile memory array is divided into a plurality of memory banks, and
wherein sense circuits are arranged between memory banks.

* * * * *